United States Patent [19]

Thurakal

[11] Patent Number: 5,043,678

[45] Date of Patent: Aug. 27, 1991

[54] PHASE LOCK LOOP

[75] Inventor: Philip J. Thurakal, New Milford, N.J.

[73] Assignee: Allied-Signal Inc., Morris Township, Morris County, N.J.

[21] Appl. No.: 457,440

[22] Filed: Dec. 27, 1989

[51] Int. Cl.$^5$ .......................... H03L 7/08; H03L 7/16
[52] U.S. Cl. ..................................... 331/16; 331/17; 331/DIG. 2
[58] Field of Search ................. 331/17, 108 C, 108 D, 331/16, 8, DIG. 2, 117 R

[56] References Cited

U.S. PATENT DOCUMENTS

| | | | |
|---|---|---|---|
| 4,437,072 | 3/1984 | Asami | 331/DIG. 2 |
| 4,513,448 | 4/1985 | Maher | 331/DIG. 2 |
| 4,714,899 | 12/1987 | Kurtzman | 331/16 X |

FOREIGN PATENT DOCUMENTS 0148410  11/1979  Japan ........................... 331/DIG. 2

OTHER PUBLICATIONS

Uzunoglu, V., "Build a Linear-IC Phase-Locked Loop", *Electronic Design* 10, May 9, 1978, pp. 90-93.

*Primary Examiner*—David Mis
*Attorney, Agent, or Firm*—Howard G. Massung; Robert A. Walsh

[57] ABSTRACT

A Phase Locked Loop including a monolithic Phase Locked Loop component. The monolithic component has an internal amplifier stage and an internal VCO. An external phase detector compares the phase of a reference signal to the phase of the output of the internal VCO to provide a signal which is a measure of the phase differences. The signal is filtered by an external filter, amplified by the internal amplifier stage and input to the internal VCO.

13 Claims, 3 Drawing Sheets

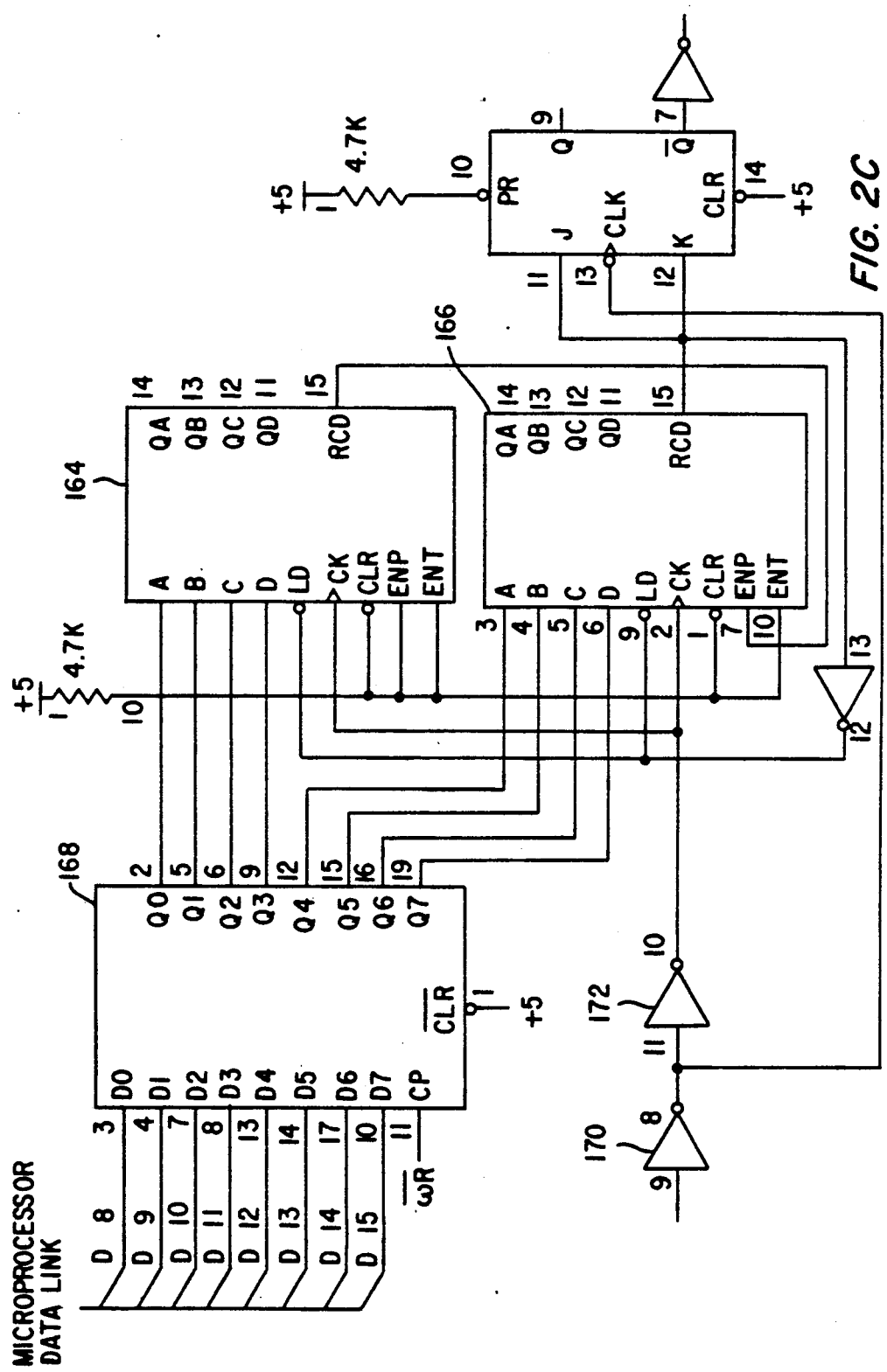

PHASE LOCK LOOP

BACKGROUND OF THE INVENTION

This invention relates to Phase Locked Loop (PLL) circuits. More specifically, it relates to a PLL circuit which incorporates a monolithic PLL.

PLL circuits typically consist of a phase detector, a filter, an amplifier and a Voltage-Controlled Oscillator (VCO) arranged in a loop circuit. The phase detector compares the phase of an input signal to the phase of the output of the VCO and causes the amplifier to output a signal which is a measure of the phase difference of the two signals. PLL circuits are typically used to provide a stable clock output. Other uses include tone decoding, demodulation, frequency multiplication, frequency synthesis and the regeneration of signals.

Early PLL circuits were implemented with discrete components and were complex. The complexity led to a reluctance to use PLL circuits, however, the development of monolithic PLL components, such as the Signetics 564 has alleviated the earlier reluctance. The monolithic components are relatively inexpensive and easy to use.

These monolithic P11 components, however, provide fixed circuitry which must be used, even if the circuitry is not particularly suited to the desired function. For example, the Signetics 564 provides a mixer stage which, if used, introduces modulations in the frequency. This results in frequency variations in the output of the PLL circuit. Another problem frequently encountered is the type of phase detector used. Most monolithic PLL components utilize a Type I phase detector wherein the phase of an analog signal is measured. In many cases, particularly at high frequencies, it is prefered to use a Type II phase detector which is driven by digital transitions.

For some of the more demanding applications, therefore, it is desirable to utilize a PLL having specially designed circuitry. In these cases, however, it has already been noted that the circuitry is complex. Furthermore, specialized components, such as a VCO, frequently are not suitable for these demanding applications. For example, off the shelf VCOs do not have the range of linearity required for high frequency applications.

A Phase Locked Loop having high frequency capabilities, a wide locking band and fast locking, therefore, is needed.

SUMMARY OF THE INVENTION

This invention Provides a PLL Circuit. In a preferred embodiment, the circuit includes a monolithic PLL component having an internal amplifier stage and an internal VCO. The amplifier stage output is connected to the VCO input. A Phase detector having a first input which can be connected to a reference signal and a second input which is connected to the VCO output is provided. A filter is provided between the output of the phase detector and the input of the amplifier stage. The phase detector compares the phase of the reference signal to the phase of the VCO output to output a signal which is a measure of the phase difference. If needed, a counter can be interconnected between the VCO output and the second input to the phase detector to divide the VCO output to a desired frequency.

It is an object of the invention to provide a PLL circuit having high frequency capabilities.

It is another object of the present invention to provide a PLL circuit having a highly stable frequency output.

DESCRIPTION OF THE PREFERRED EMBODIMENT

Figure 1:
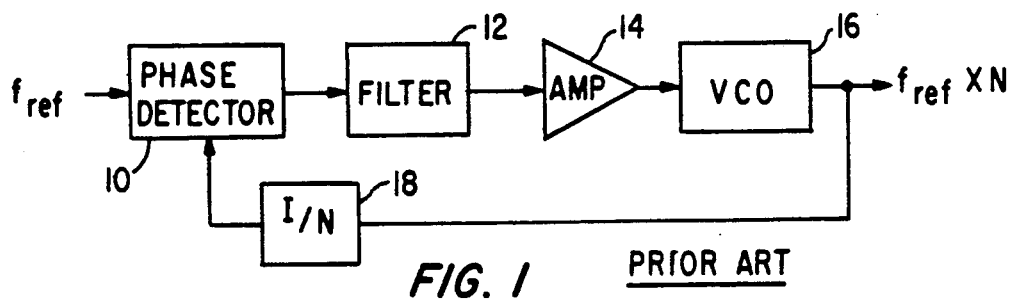
FIG. 1 is a block diagram of a prior art Phase Locked Loop circuit.

FIG. 1 illustrates a block diagram of a conventional PLL circuit. The circuit includes a phase detector 10, a filter 12, an amplifier 14, a voltage-controlled oscillator (VCO) 16 and a counter 18 arranged in a conventional loop circuit. A reference signal, $f_{ref}$ is provided to a first input of the phase detector 10. The output of the phase detector 10 is connected to the input of the filter 12. The output of the filter 12 is connected to the input of the amplifier 14. The output of the amplifier provides a signal (a voltage) which is a measure of the phase detector 10 output and which is proportional to $f_{ref}$ when the loop is locked. This output has particular application in FM demodulation. The output of the amplifier 14 is connected to the input of the VCO 16. The VCO 16 changes the voltage output of the amplifier 14 into a frequency. The output of the VCO 16 can be connected directly to the second input of the phase detector 10, however, it is common to interconnect a counter 18 between the output of the VCO 16 and the second input of the phase detector 10. The counter 18 acts to divide the frequency output of the VCO 16, thereby providing greater flexibility. The output frequency of the VCO 16, in this case, is $f_{ref} \times N$, where 1/N is the counter division constant The phase detector 10, therefore, determines the phase difference of the signal $f_{ref}$ and the divided output of the VCO 16. The VCO 16 frequency output locks on the frequency of the reference signal if conditions are right.

The above circuit can either be implemented with discrete components or with a monolithic component, for example, a Signetics 564. The monolithic PLL components provide all of the needed functions internally. As mentioned before, however, the applications of a monolithic component are limited to those where the internally fixed circuits provide the needed functions. Applications commonly arise where the available monolithic devices fail to meet the required specifications. Commonly encountered problems include VCO's 16 without sufficient linearity at high frequencies, for example, at 25 MHz. Another limitation frequently encountered is the lack of stability of the output frequency. For example, the Signetics 564 includes a mixer stage which, if used, modulates the input frequency and creates undesirable ripples in the output. These ripples create extra frequencies in the output and, therefore, severely limit the frequency stability of the output. Furthermore most monolithic PLLs utilize a Type I Phase detector which is an exclusive OR type phase detector meant for use with analog or square wave digital signals. Type I phase detectors always generate an output which is filtered, so that there is always some ripple in the output which will cause frequency variations in the PLL output.

To overcome these problems, the present invention uses some of the internal circuitry of a monolithic PLL component in conjunction with external circuitry. The present invention, therefore, takes maximum advantage of the benefits of the monolithic devices and reduces component count while producing a highly stable output.

Figure 2B:
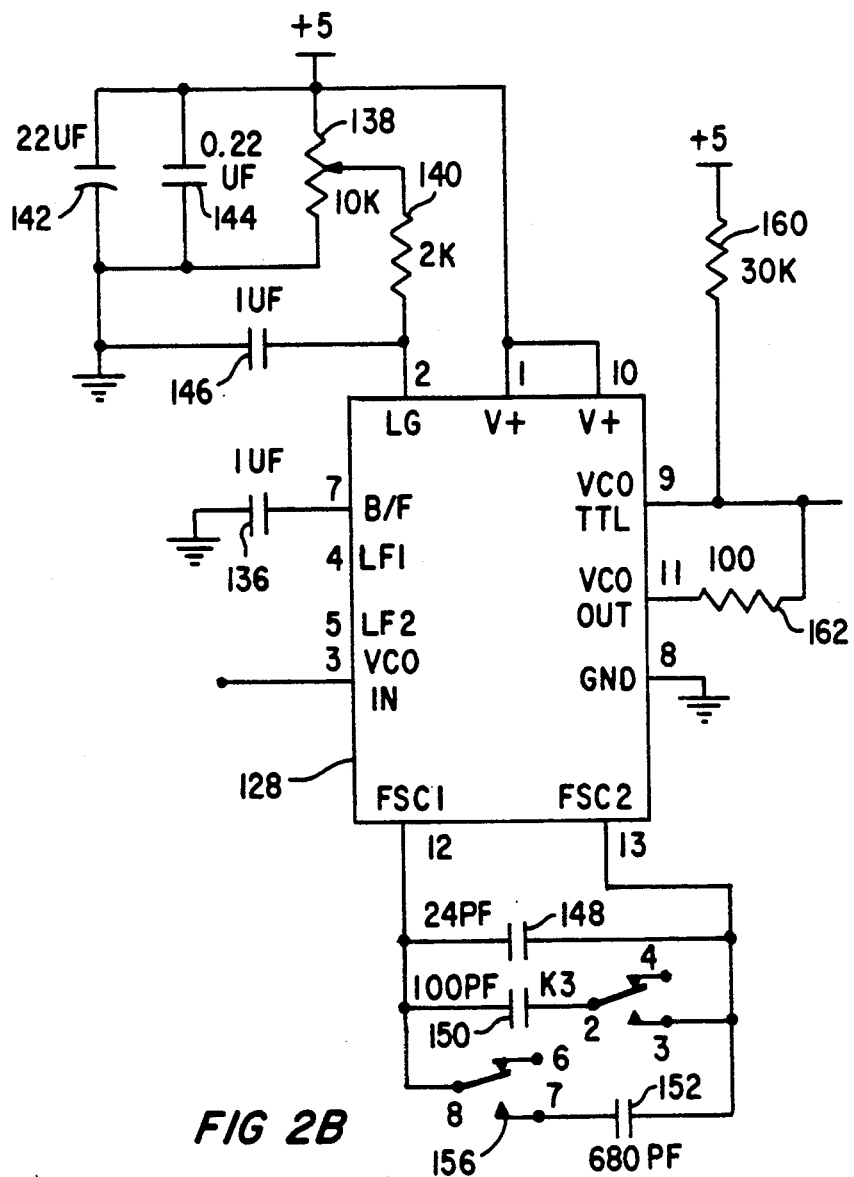
FIG. 2 is a schematic circuit of a preferred embodiment of the present invention.
Figure 2A:
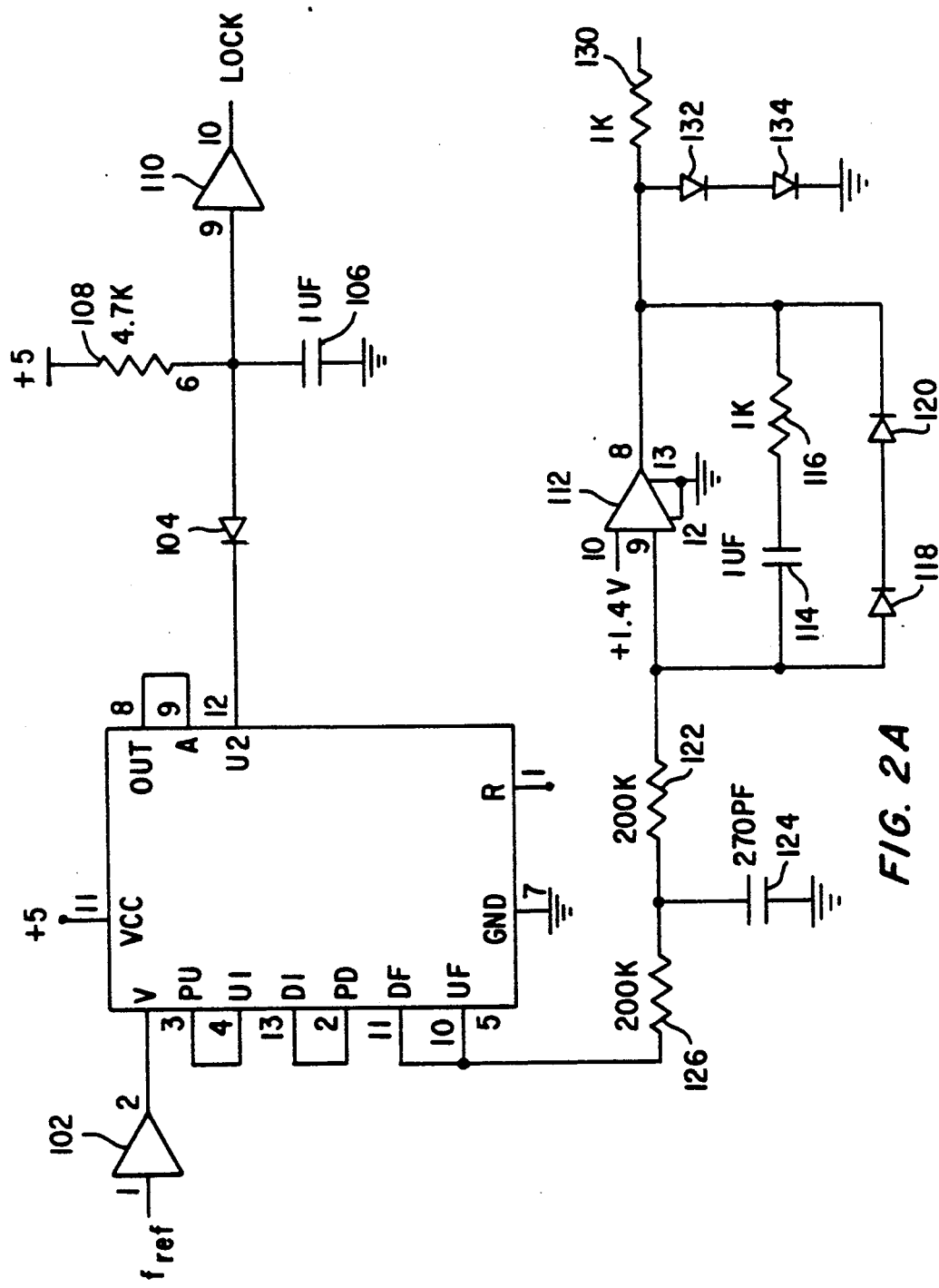

Referring to FIG. 2, a preferred embodiment of the present invention is illustrated. The PLL of the present invention utilizes a phase detector 100. A preferred phase detector 100 is the MC4344 manufactured by Motorola. The MC 4344 has two internal circuits. The first circuit is a Type II phase detector circuit and the second is a Type I phase detector circuit. Both circuits receive the reference signal $f_{ref}$ as a first input at pin 3 of the phase detector 100. A second input to both circuits is provided at pin 1 of the phase detector 100.

The second internal phase detector circuit (Type I) provides an output at pin 12. This output in conjunction with the diode 104, the capacitor 106, the resistor 108 and the buffer 110 provide the PLL of the present invention with a lock detection indicator. When the phases of the signals at pins 3 and 1 of the phase detector are equal, therefore, the output of the buffer 110 is active. The components 104, 106, 108 and 110 form a wave shaping circuit for the indicator signal.

The first internal phase detector circuit (Type II) in the component 100 provides an output at pins 10 and 11 which are tied together. This output is a signal indicative of the phase difference between the phase detector input signals at pins 3 and 1. Since it is a Type II phase detector output, the width of the pulses in the output signal at pins 10 and 11 is equal to the time between the respective edges of the signals at the input pins 3 and 1.

The output signal from pins 10 and 11 is input to a filter comprising an amplifier 112, a capacitor 114, a resistor 116, two diodes 118 and 120, a resistor 122, a capacitor 124 and a resistor 126. The output signal is input to the negative input of the amplifier 112. The positive input of the amplifier 112 is biased at a reference voltage, in this case 1.4 V. The reference voltage is selected in accordance with a charge pump circuit in the phase detector 100 so as to obtain optimum performance from the phase detector 100. The filter circuit provides low pass filtering of the output signal from the phase detector 100.

The filter output is connected to the input of the monolithic PLL component 128. It is preferred to connect the filter output through a clamping circuit comprising a resistor 130 and two diodes 132 and 134. The clamping circuit limits the filter output to two diode potential drops above ground, thereby improving the locking speed of the PLL of the present invention.

A preferred monolithic PLL 128 is the 564 manufactured by Signetics. The 564 includes a limiter stage, a phase comparator stage, a filter/amplifier stage and a VCO. The internal VCO is highly linear even at high frequencies, thereby enabling a highly stable output frequency in the PLL of the present invention.

The filter output from pin 8 of the amplifier 112 is connected to pin 3 of the monolithic PLL 128. It is preferred to connect a capacitor 136 between pin 7 of the monolithic PLL 128 and ground to provide high frequency filtering. It is further preferred that the resistors 138 and 140 and the capacitors 142, 144 and 146 be interconnected as illustrated between the supply voltage and the pins 1, 2, and 10 of the monolithic PLL 128. This interconnection provides power supply decoupling and appropriately biases the monolithic PLL 128 to obtain the appropriate locking range. It is further preferred to interconnect the capacitors 148, 150 and 152 and the switches 154 and 156 between pins 12 and 13 of the monolithic PLL 128, as illustrated. This interconnection provides a selectable range of output frequencies.

By interconnecting the monolithic PLL 128 as illustrated in FIG. 2, the monolithic PLL 128 is configured to be an amplifier in series with a VCO. The filtered signal from the amplifier 112 is, therefore, amplified and then input to a VCO. The VCO converts the filtered output from the phase detector 100 into a frequency. This frequency is output on Pin 9 of the monolithic PLL 128. The resistor 162 is interconnected between the pins 9 and 11 of the monolithic PLL 128 to provide current limiting to protect the monolithic PLL 128 from failure at output transition points.

The output on pin 9 of the monolithic PLL 128 could be connected to the second input of the phase detector 100 at pin 1 if it were at the correct frequency, that is the frequency of the reference signal. To provide more flexibility, however, the monolithic PLL 128 output is connected to the Phase detector 100 at pin 1 through a counter circuit. The counter circuit functions to divide the frequency output of the VCO by a desired number. The counter circuit includes components 164 and 166 which are 4 bit counters, preferably an F161. The components 164 and 166 are interconnected in a standard way to provide an eight bit counter and, therefore, a divider which can divide by 1 to 256. A latch 168 is provided to store the desired number by which the VCO output is to be divided. In a preferred embodiment, a microprocessor (not shown) writes the number into the latch 168 on the microprocessor data lines. The output pin 9 of the monolithic PLL 128 is connected to the clock inputs (pin 2) of the counter components 164 and 166 through the buffers 170 and 172.

The output of the eight bit counter formed by the components 164 and 166 is pin 15 of the component 166. This output does not have a 50% duty cycle. To obtain the 50% duty cycle, a flip flop 174 is connected to the output of the eight bit counter 166 and 168. The output from the flip flop 174 at pin 7 is connected to the second input of the phase detector 100 at pin 1 through a buffer 176. Note that the flip flop 174 further divides the signal by two, so that the entire counter circuit provides a divide by range of 2 to 512.

Note also that the entire circuit is powered by a single positive voltage, that is +5 volts. This feature is particularly advantageous in TTL digital systems wherein typically only a single positive power supply is available.

The circuit of the present invention provides a highly stable output frequency. By using the monolithic PLL 128 the component count is kept to a minimum. Furthermore the monolithic PLL 128 provides a highly linear VCO at high frequencies. Also the Type II phase detector 100 minimizes ripples in its output voltage, thereby further reducing frequency variations in the output of the PLL of the present invention.

I claim:

1. A phase locked loop, comprising:
  a monolithic component including an amplifier and a voltage controlled oscillator separate from the amplifier;

circuitry external the monolithic component including a phase detector, a phase lock detection indicator, a filter, a clamp and a counter;

the phase detector receiving a signal having a reference frequency and connected to the counter for comparing the phase of the reference frequency to the phase of a frequency output from the counter, and for providing a signal commensurate with the difference between the compared phases;

the phase lock detection indicator connected to the phase detector and responsive to the signal therefrom when the phases of the compared frequencies are equal for providing a phase lock indicating signal;

the filter connected to the phase detector for filtering the phase difference signal from the phase detector and for providing a filtered signal;

the clamp connected to the filter for limiting the amplitude of the filtered signal to a predetermined level for providing a clamped filtered signal;

the amplifier connected to the clamp for amplifying the clamped filtered signal therefrom;

the voltage controlled oscillator connected to the clamp and responsive to the amplified clamped filtered signal therefrom for providing a frequency output; and the counter connected to the voltage controlled oscillator for dividing the frequency output therefrom by a predetermined number and for providing the frequency output, the phase of which is compared by the phase detector to the phase of the reference frequency.

2. A phase locked loop as described by claim 1, including:
a latch connected to the counter for latching the predetermined number by which the frequency output from the voltage controlled oscillator is divided.

3. A phase locked loop as described by claim 1, including:
a single power source connected to the monolithic component and to the external circuitry for powering said component and said circuitry.

4. A phase locked loop as described by claim 1, including:
a plurality of capacitors; and,
switching means connected to the voltage controlled oscillator and to the plurality of capacitors, and operable for connecting selected capacitors of the plurality of capacitors to the voltage controlled oscillator, whereby said voltage controlled oscillator provides a frequency output over a selectable range.

5. A phase locked loop as described by claim 3, including:
means connected between the power source and the monolithic component for decoupling the power source therefrom to bias the monolithic component in accordance with a desired phase locking range.

6. A phase locked loop comprising:
a monolithic component including an amplifier and a voltage controlled oscillator separate from the amplifier;
circuitry external the monolithic component including a phase detector and a phase lock detection indicator;
the phase detector receiving a signal having a reference frequency and connected to the voltage controlled oscillator for comparing the phase of the reference frequency to the phase of a frequency output from the voltage controlled oscillator, and for providing a signal commensurate with the difference between the compared phases;

the phase lock detection indicator connected to the phase detector and responsive to the signal therefrom when the phases of the compared frequencies are equal for providing a phase lock indicating signal;

the amplifier connected to the phase detector for amplifying the signal therefrom; and the voltage controlled oscillator connected to the amplifier and responsive to the amplified signal therefrom for providing the frequency output, the phase of which is compared by the phase detector to the phase of the reference frequency.

7. A phase locked loop as described by claim 6, including:
a filter connected to the phase detector and to the amplifier for filtering the phase difference signal from the phase detector and for providing a filtered signal.

8. A phase locked loop as described by claim 7, including:
a clamp connected to the filter for limiting the amplitude of the filtered signal and for providing a clamped filtered signal;
the amplifier connected to the clamp for amplifying the clamped filtered signal therefrom; and
the voltage controlled oscillator connected to the clamp and responsive to the amplified clamped filtered signal therefrom for providing the frequency output, the phase of which is compared by the phase detector to the phase of the reference frequency.

9. A phase locked loop as described by claim 8, including:
a counter connected to the voltage controlled oscillator for dividing the frequency output therefrom by a predetermined number and for providing the frequency output, the phase of which is compared by the phase detector to the phase of the reference frequency.

10. A phase locked loop as described by claim 9, including:
a latch connected to the counter for latching the predetermined number by which the frequency output from the voltage controlled oscillator is divided.

11. A phase locked loop as described by claim 10, including:
a single power source connected to the monolithic component, the external circuitry, the filter, the clamp and the counter for powering said component, said external circuitry, said filter, said clamp and said counter.

12. A phase locked loop as described by claim 6, including:
a plurality of capacitors; and,
switching means connected to the voltage controlled oscillator and to the plurality of capacitors, and operable for connecting selected capacitors of the plurality of capacitors to the voltage controlled oscillator, whereby said voltage controlled oscillator provides a frequency output over a selectable range.

13. A phase locked loop as described by claim 11, including:
means connected between the power source and the monolithic component for decoupling the power source therefrom to bias the monolithic component in accordance with a desired phase locking range.

* * * * *